US012027421B2

(12) United States Patent
Reboh

(10) Patent No.: US 12,027,421 B2
(45) Date of Patent: Jul. 2, 2024

(54) LOW-TEMPERATURE METHOD FOR TRANSFER AND HEALING OF A SEMICONDUCTOR LAYER

(71) Applicant: COMMISSARIAT A L'ENERGIE ATOMIQUE ET AUX ENERGIES ALTERNATIVES, Paris (FR)

(72) Inventor: Shay Reboh, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 131 days.

(21) Appl. No.: 17/216,842

(22) Filed: Mar. 30, 2021

(65) Prior Publication Data

US 2021/0305097 A1 Sep. 30, 2021

(30) Foreign Application Priority Data

Mar. 31, 2020 (FR) .................... 20 03199

(51) Int. Cl.
*H01L 21/78* (2006.01)
*H01L 21/02* (2006.01)
*H01L 21/822* (2006.01)

(52) U.S. Cl.
CPC .... *H01L 21/7806* (2013.01); *H01L 21/02694* (2013.01); *H01L 21/8221* (2013.01)

(58) Field of Classification Search
CPC .......... H01L 21/7806; H01L 21/02694; H01L 21/8221; H01L 21/187; H01L 21/3226;
(Continued)

(56) References Cited

U.S. PATENT DOCUMENTS

2008/0171423 A1* 7/2008 Ieong ............... H01L 21/84
257/E21.633
2019/0202688 A1* 7/2019 Benaissa ............ B81C 1/00507
(Continued)

FOREIGN PATENT DOCUMENTS

CN 107667416 A * 2/2018 ....... H01L 21/02381
EP 2551897 A1 * 1/2013 ....... H01L 21/76254
(Continued)

OTHER PUBLICATIONS

French Preliminary Search Report dated Dec. 3, 2020 in French Application 20 03199 filed on Mar. 31, 2020, 2 pages (with English Translation of Categories of Cited Documents).
(Continued)

*Primary Examiner* — Mohammed Shamsuzzaman
(74) *Attorney, Agent, or Firm* — Oblon, McClelland, Maier & Neustadt, L.L.P.

(57) ABSTRACT

A method for creating a substrate of the semiconductor on insulator type includes steps of a) providing a donor substrate having a monocrystalline support substrate, a smoothing layer and a semiconductor layer, the smoothing layer forming an etch stop layer with respect to the material of the support substrate; a') implantation of ion species through the semiconductor layer to form a fragilisation plane; b) creating an assembly by placing the donor substrate and a receiver substrate in contact; and c) transferring the semiconductor layer and at least a part of the smoothing layer by detachment along the fragilization plane. The semiconductor layer provided in a) is monocrystalline. The method may further include, before b), amorphization of at least a part of the semiconductor layer to form an amorphous layer; and during or after c), recrystallization in solid phase of the amorphous layer to form a transferred monocrystalline semiconductor layer.

20 Claims, 5 Drawing Sheets

(58) Field of Classification Search
CPC ........... H01L 21/76256; H01L 27/0688; H01L 21/76254
See application file for complete search history.

(56) References Cited

U.S. PATENT DOCUMENTS

| | | | |
|---|---|---|---|
| 2021/0057267 A1* | 2/2021 | Acosta Alba | H01L 21/3226 |
| 2021/0098265 A1* | 4/2021 | Maitrejean | H01L 29/7847 |
| 2021/0183690 A1* | 6/2021 | Reboh | H01L 21/268 |

FOREIGN PATENT DOCUMENTS

| | | | | |
|---|---|---|---|---|
| EP | 2551898 A1 * | 1/2013 | ....... | H01L 21/26506 |
| EP | 3840033 A1 * | 6/2021 | ....... | H01L 21/02002 |
| FR | 3 045 934 A1 | 6/2017 | | |
| FR | 3 045 935 A1 | 6/2017 | | |
| FR | 3 063 834 A1 | 9/2018 | | |
| FR | 3104811 A1 * | 6/2021 | ....... | H01L 21/26506 |
| WO | WO-0111667 A1 * | 2/2001 | ....... | H01L 21/76254 |

OTHER PUBLICATIONS

U.S. Appl. No. 16/535,367, filed Aug. 8, 2019, 2020/0058768 A1, Coquand, R, et al.
U.S. Appl. No. 16/580,396, filed Sep. 24, 2019, 2020/0098859 A1, Reboh, S, et al.
U.S. Appl. No. 16/590,557, filed Oct. 2, 2019, 2020/0111872 A1, Reboh, S, et al.
U.S. Appl. No. 16/709,993, filed Dec. 11, 2019, 2020/0194273 A1, Reboh, S, et al.
U.S. Appl. No. 16/733,006, filed Jan. 2, 2020, 2020/0219762 A1, Reboh, S, et al.
U.S. Appl. No. 16/812,530, filed Mar. 9, 2020, 2020/0212179 A1, Reboh, S, et al.
U.S. Appl. No. 16/914,541, filed Jun. 29, 2020, 2021/0005443 A1, Gaben, L, et al.
U.S. Appl. No. 16/993,894, filed Aug. 14, 2020, 2021/0057267 A1, Acosta Alba, P, et al.
U.S. Appl. No. 17/103,219, filed Nov. 24, 2020, Maitrejean, S, et al.
U.S. Appl. No. 17/124,184, filed Dec. 16, 2020, Reboh, S, et al.

* cited by examiner

LOW-TEMPERATURE METHOD FOR TRANSFER AND HEALING OF A SEMICONDUCTOR LAYER

TECHNICAL FIELD

The field of the invention is that of the integrated circuits provided with microelectronic components spread over several levels, in particular superimposed transistors. Such circuits are generally qualified as three-dimensional or "3D" integrated devices. The invention is aimed more specifically at a method for creating such a device with superimposed components via a transfer onto a first level of components of a monocrystalline layer intended to be used for the manufacturing of a second layer of components.

PRIOR ART

In general, in the field of integrated circuits, it is continually sought to increase the density of transistors. For this, one solution involves spreading the transistors over several levels of semiconductor layers disposed on top of each other to form a 3D device. Such a 3D device thus generally includes a lower level provided with a first semiconductor layer from which transistors are formed and at least one upper level provided with at least one second semiconductor layer from which transistors are formed, the first and the second semiconductor layer being superimposed.

The creation of the 3D device can involve the implementation of a step of assembly of a lower level in which transistors have for example already been created and of a silicon-on-insulator (SOI) substrate in which the semiconductor layer of an upper level is located. The assembly between the SOI substrate and the lower level is generally carried out by bonding.

The SOI substrate is then thinned down to the semiconductor layer of the upper layer. This thinning can be carried out by etching of the rear face of the SOI substrate. Alternatively, the semiconductor layer of the upper layer can be transferred onto the lower layer according to the Smart Cut™ method from the SOI substrate. This transfer comprises, before the bonding, the implantation of ion species into the SOI substrate so as to form a fragilization plane and, after the bonding, the breaking of the SOI substrate along the fragilization plane.

In both cases, the layer of buried oxide (BOX) of the SOI substrate is used as a stop layer for the thinning etching, which allows to obtain a fine semiconductor layer made of silicon having a uniform thickness. These two methods have, however, the disadvantage of being relatively costly because of the manufacturing cost of the SOI substrate.

One solution to reduce these costs would involve manufacturing the semiconductor layer of the upper level by Smart Cut™ not from an SOI substrate but directly from a bulk silicon substrate.

In order to ensure a correction of the post-fracture surface roughness and to thin the semiconductor layer to the desired thickness, methods such as thermal oxidations having a significant thermal budget, for example approximately 900-1200° C., are conventionally carried out. Such a thermal budget can lead to a degradation of the components of the lower level so that these methods are not adapted for the design of 3D circuits.

It is moreover necessary to eliminate defects capable of affecting the mobility of the charge carriers that were introduced by implantation of ion species into the crystalline matrix of the semiconductor layer of the upper layer. A healing of these defects can conventionally be obtained via a heat treatment at temperatures greater than 900° C. Such a heat treatment is also capable of degrading the components of the lower level, and this healing cannot therefore be implemented in the context of design of 3D devices.

DISCLOSURE OF THE INVENTION

One goal of the invention is to propose a method for designing 3D devices in which the crystalline layer of the upper layer is obtained by transfer from a bulk silicon substrate and in which the correction of the post-fracture surface roughness, the control of the thickness of the transferred layer and the healing of the defects present in the latter can be obtained without degradation of the components of the lower level.

In one embodiment, a method for creating a substrate of the semiconductor on insulator type, comprises the following steps:
  a) providing a donor substrate comprising a monocrystalline support substrate, a smoothing layer and a semiconductor layer, the smoothing layer forming an etch stop layer with respect to the material of the support substrate;
  a') implantation of ion species through the semiconductor layer so as to form a fragilisation plane;
  b) creating an assembly by placing the donor substrate and a receiver substrate in contact;
  c) transferring the semiconductor layer and at least a part of the smoothing layer by detachment along the fragilization plane, wherein the semiconductor layer of the donor substrate provided in step a) is monocrystalline and wherein the method further comprises the following steps:
  before step b), amorphization of at least a part of the semiconductor layer to form an amorphous layer; and
  during or after step c), recrystallization in solid phase of the amorphous layer to form a transferred monocrystalline semiconductor layer.

Alternatively the method for creating a substrate of the silicon on insulator type, comprises the following steps:
  a) providing a donor substrate comprising a monocrystalline support substrate, a smoothing layer and a semiconductor layer, the smoothing layer forming an etch stop layer with respect to the material of the support substrate;
  b) creating an assembly by placing the donor substrate and a receiver substrate in contact;
  c) transferring the semiconductor layer, the smoothing layer and a part of the support substrate onto the receiver substrate;
  d) carrying out a selective etching of said part of the support substrate with respect to the smoothing layer;
  wherein the semiconductor layer of the donor substrate provided in step a) is monocrystalline and wherein the method further comprises the following steps:
  before step b), amorphization of at least a part of the semiconductor layer to form an amorphous layer; and
  during or after step c), recrystallisation in solid phase of the amorphous layer to form a transferred monocrystalline semiconductor layer.

Certain preferred but non-limiting aspects of this method are the following:
  said recrystallisation is followed by an amorphization of the transferred monocrystalline semiconductor layer to form a new amorphous layer and by a recrystallisation in solid phase of the new amorphous layer to form a new transferred monocrystalline semiconductor layer;

it further comprises a removal of a layer rich in interstitial atoms, present on the surface of the transferred monocrystalline semiconductor layer, said removal comprises plasma-assisted oxidation followed by chemical etching;

the amorphization of at least a part of the semiconductor layer comprises the amorphization of the entirety of the semiconductor layer;

the amorphization of at least a part of the semiconductor layer comprises the joint amorphization of the semiconductor layer and of the smoothing layer;

step d) further comprises the carrying out of a selective etching of the smoothing layer, the donor substrate provided in step a) further comprises an intermediate layer and a thinning layer interposed between the intermediate layer and the semiconductor layer, the thinning layer forming an etch stop layer with respect to the material of the semiconductor layer and step d) further comprises the successive carrying out of a selective etching of the smoothing layer with respect to the intermediate layer, of a selective etching of the intermediate layer with respect to the thinning layer and of a selective etching of the thinning layer with respect to the semiconductor layer;

the amorphization of at least a part of the semiconductor layer comprises the joint amorphization of the semiconductor layer and of at least a part of the thinning layer;

the amorphization of at least a part of the semiconductor layer comprises the joint amorphization of the semiconductor layer, of the thinning layer and of at least a part of the intermediate layer;

the amorphization of at least a part of the semiconductor layer comprises the joint amorphization of the semiconductor layer, of the thinning layer, of the intermediate layer and of at least a part of the smoothing layer;

it comprises, before the amorphization of at least a part of the semiconductor layer, the formation on the semiconductor layer, by thermal oxidation at a temperature preferably lower than 800° C., of a dielectric layer having a thickness between for example 5 nm and 25 nm, said dielectric layer being in step b) at the interface of the donor and receiver substrates placed in contact;

said formation further comprises, after the amorphization of at least a part of the semiconductor layer, a thickening of the dielectric layer;

it further comprises before step b) an implantation of ion species in the support substrate so as to form a fragilization plane and step c) comprises the detachment of the support substrate along the fragilization plane;

it further comprises, after the formation of the amorphous layer and before said implantation, the depositing of one or more layers on the donor substrate; and the receiver substrate integrates a level of microelectronic components.

BRIEF DESCRIPTION OF THE DRAWINGS

Other aspects, goals, advantages and features of the invention will be clearer upon reading the following detailed description of preferred embodiments of the latter, given as a non-limiting example, and made in reference to the appended drawings in which.

DETAILED DESCRIPTION

The invention relates to a method for creating a substrate of the type semiconductor on insulator by transfer of a semiconductor layer onto a receiver substrate, a dielectric layer being present at the interface.

In a preferred use of the invention, the method allows to design a 3D device with superimposed microelectronic components with a receiver substrate that integrates components already manufactured on a first level. The semiconductor layer to be transferred is a layer made amorphous that is recrystallised in the monocrystalline state and can be used as an active layer for the manufacturing of components on a level superimposed on the first level. The semiconductor layer to be transferred can constitute for example a channel region for one or more transistors.

Figure 1:
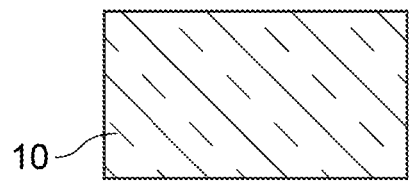
FIGS. 1 to 8 illustrate one possible embodiment of the method according to the invention.
Figure 2:
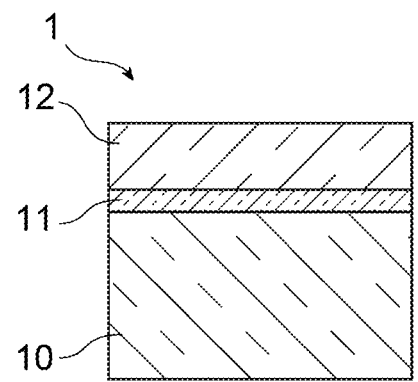

One possible implementation of the method according to the invention is illustrated by FIGS. 1 to 8. In reference to FIGS. 1 and 2, the method starts with the providing of a monocrystalline support substrate 10. A smoothing layer 11 and a monocrystalline semiconductor layer 12 are formed, for example successively as shown in FIG. 2, by epitaxy on the monocrystalline support substrate. A donor substrate 1 is thus formed which comprises the monocrystalline support substrate 10, the smoothing layer 11 and the monocrystalline semiconductor layer 12, the latter being arranged on the surface of said substrate.

The smoothing layer 11 forms an etch stop layer with respect to the material of the support substrate 10 and the material of the monocrystalline semiconductor layer 12. For this purpose, the smoothing layer 11 is made from a material having a chemical composition different than that of the support substrate and of the monocrystalline semiconductor layer, and the choice of the materials can be made according to the nature of the etching agent and the desired selectivity.

According to a preferred embodiment, the support substrate 10 comprises a first material identical to that of the monocrystalline semiconductor layer 12 and the smoothing layer 11 comprises a second monocrystalline material different from the first material. The first material is typically silicon, and the second material can be silicon-germanium.

The thickness and the concentration of germanium in the smoothing layer 11 are chosen in such a way as to obtain a pseudomorphous layer, i.e. having a thickness smaller than the critical thickness for plastic relaxation, which limits the risk of generating crystalline defects such as dislocations. Thus, the thickness of the smoothing layer is typically between 5 and 120 nm. According to a specific embodiment of the invention, the concentration of germanium in the smoothing layer is between 20 and 40%. The thickness of the monocrystalline semiconductor layer 12 is between 5 and 40 nm.

According to one embodiment, the donor substrate is covered with a dielectric layer. Said dielectric layer can be in particular a layer of an oxide or of a nitride of a semiconductor material. Said dielectric layer will form all or a part of the buried insulating layer of the semiconductor-on-insulator substrate. One possible formation of this dielectric layer on the donor substrate will be described below.

Alternatively, the donor substrate is not covered with such a dielectric layer and it is its free surface that forms the surface of the donor substrate. In this case, the buried insulating layer of the substrate consists of a dielectric layer formed on the receiver substrate to which the donor substrate is bonded with a view to the transfer of the semiconductor layer.

Figure 3A:
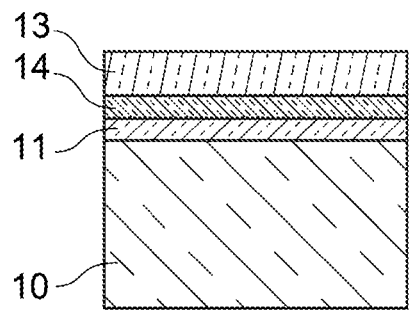

In reference to FIG. 3A, the method comprises an amorphization of at least a part of the semiconductor layer 12. This amorphization is carried out by ion implantation, for example of Ge or Si ions, the energy and the dose of which are chosen according to the thickness of material to be made amorphous.

The process of amorphization is known to generate a layer rich in interstitial atoms close to the part made amorphous in the underlying part remaining crystalline. In the example illustrated in FIG. 3A, only a surface part of the semiconductor layer 12 is made amorphous (thus forming an amorphous layer 13) and there is a layer rich in interstitial atoms 14 between the amorphous layer 13 and the smoothing layer 11.

Figure 4:
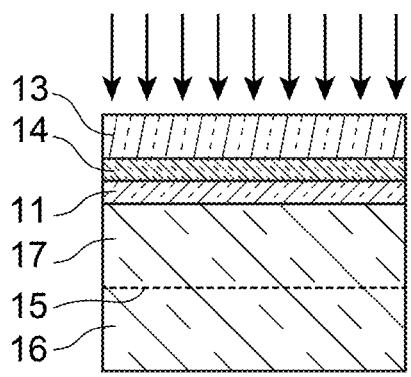

FIG. 4 illustrates the implementation of an implantation of ion species, for example of hydrogen and/or of helium, in the support substrate 10 so as to form a fragilization plane 15 defining a portion (formed from the amorphous layer 13, the layer rich in interstitial atoms 14, the smoothing layer 11 and a part 17 of the support substrate) to be transferred by the Smart Cut™ method.

The amorphization described above can, alternatively, be carried out after this implantation of ion species to form the fragilization plane.

Figure 3B:
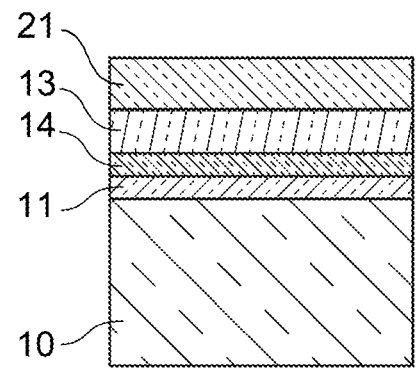

When the amorphization is carried out before the implantation of ion species, the method can comprise, after the amorphization and before the implantation, the deposition of one or more layers on the donor substrate, for example of oxide, of nitride, of polysilicon doped or not. As shown in FIG. 3B, dielectric layer 21 is formed on the donor substrate. This deposition is preferably carried out at a temperature allowing to avoid a recrystallisation of the amorphous layer, for example at a temperature lower than 500° C.

As an alternative, notably in case of a smoothing layer relatively thick (for example a smoothing layer 11 of SiGe with a germanium concentration between 20 and 25% and having a thickness between 50 and 120 nm), the fragilization plane 15 could be made into the smoothing layer. With this alternative, we thus avoid the need of the first wet etching step of the part 17 of the support substrate which is specify in the following.

Figure 5:
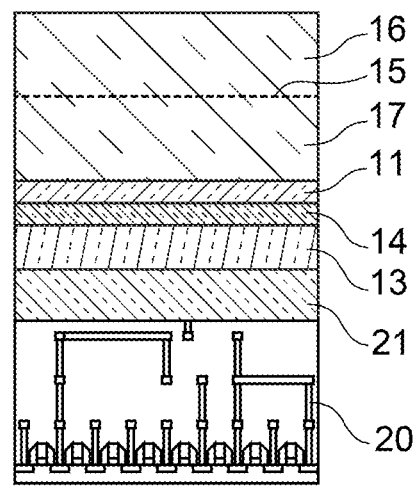

FIG. 5 illustrates the bonding of the donor substrate to the receiver substrate 20, a dielectric layer 21 being at the bonding interface. This dielectric layer 21 can result from the previous formation of a dielectric layer on the donor substrate and/or on the receiver substrate. In a preferred embodiment, the receiver substrate integrates components such as transistors.

Figure 6:
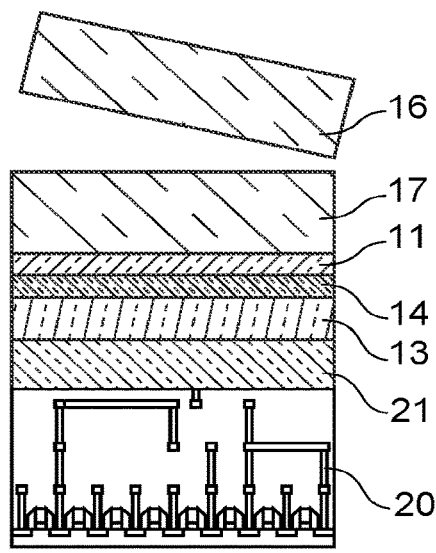

The detachment of the donor substrate along the fragilization plane 15 is then carried out, for example by providing thermal energy. FIG. 6 illustrates the structure obtained after this detachment, the part 17 of the support substrate being located at the surface of said structure.

After the transfer, the transferred part of the donor substrate undergoes a finishing treatment carrying out a smoothing (reduction of the roughness) and a thinning allowing to reach the desired thickness for the transferred semiconductor layer.

This finishing treatment comprises a first wet etching of the part 17 of the support substrate, which is located on the surface of the structure obtained after the transfer, said etching being selective with respect to the material of the smoothing layer 11. For example, if the support substrate is made of silicon and the intermediate layer is made of silicon-germanium, the etching agent can based on TMAH or TEAH.

In the example described here, this finishing treatment comprises a second wet etching of the smoothing layer 11, which is located on the surface of the structure obtained after the first etching of the part 17 of the support substrate, said second etching being selective with respect to the material of the semiconductor layer. For example, if the smoothing layer is made of silicon-germanium and the semiconductor layer is made of silicon, the etching agent can be based on a mixture of $CH_3COOH$, HF and $H_2O_2$.

Figure 7:
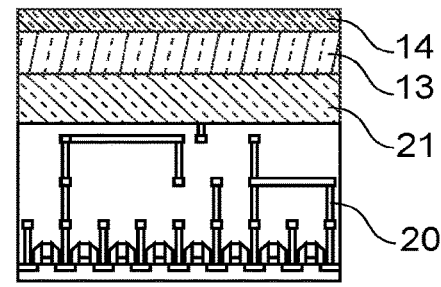

FIG. 7 illustrates the structure obtained after these etchings. There is the amorphous layer 13 and the layer rich in interstitial atoms 14 supported by the receiver substrate 20. The advantage of this finishing treatment is that it allows to obtain a transferred semiconductor layer having a uniform thickness and a low roughness without involving a thermal budget capable of degrading components that are integrated into the receiver substrate.

Figure 8:
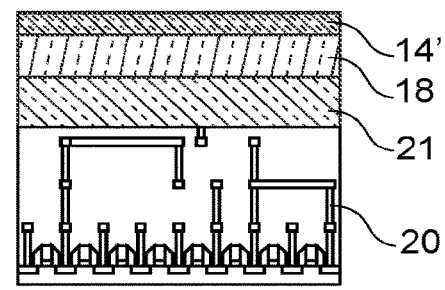

The method continues with a step of recrystallisation in solid phase (SPER for Solid Phase Epitaxial Regrowth) of the at least a part of the semiconductor layer previously made amorphous, namely the layer 13 in the example described here. As shown in FIG. 8, the layer 13 is thus recrystallised and forms a transferred monocrystalline semiconductor layer 18.

This recrystallisation can be obtained via annealing at a temperature typically greater than 450° C., preferably less than 650° C., for example at 500° C., for a time that depends on the thickness of the material to be recrystallised. This time is between several minutes for annealing at high temperature for the recrystallisation of a fine layer and a dozen hours for annealing at lower temperature for the recrystallisation of a thicker layer.

The combination of the amorphization and the recrystallization allows to obtain a monocrystalline transferred layer 18 healed of defects generated by the ion implantation carried out to form the fragilization plane. This healing is obtained without involving a thermal budget capable of degrading components that are integrated into the receiver substrate.

This step of recrystallisation in solid phase can be implemented in the form of a finishing treatment carried out after detachment of the donor substrate along the fragilization plane as described above. It can also be carried out during the detachment via the providing of thermal energy which is thus provided to the assembly of the donor and receiver substrates. When carried out after detachment, this recrystallisation step can be carried out before or after the etching of the smoothing layer 11. When carried out before this etching, it is implemented at a temperature, for example between 500° C. and 650° C., that allows to not generate dislocations in the smoothing layer.

After the recrystallisation, as shown in FIG. 8, above the transferred monocrystalline semiconductor layer 18 there is a layer 14' rich in interstitial atoms. In one possible embodiment, the method comprises a step of removal of this layer 14' rich in interstitial atoms. This removal step preferably comprises an oxidation of the layer 14' followed by a removal of the oxidised layer 14'. The oxidation can comprise oxidation chemical, preferably at low-temperature, of the layer 14'. The oxidation can also comprise plasma-assisted oxidation, preferably at low temperature (for example between 400° C. and 450° C.). The removal of the oxidised layer 14' can comprises chemical etching, for example based on HF.

Figure 9:
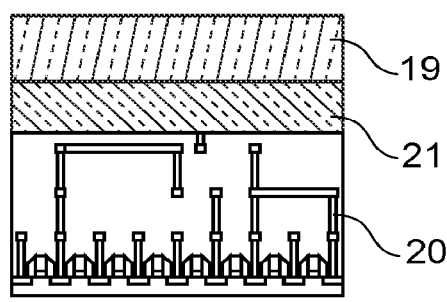
FIGS. 9 and 10 illustrate the implementation of a new sequence of amorphization/recrystallization.
Figure 10:
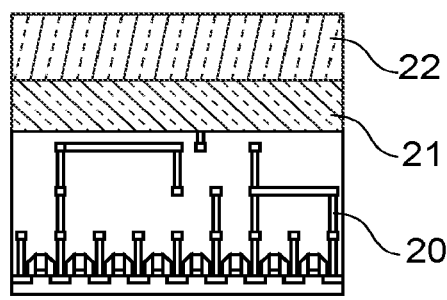

In another possible embodiment illustrated in FIGS. 9 and 10, after the recrystallisation and preferably after the etching of the smoothing layer, the method comprises an additional amorphization that leads to the formation of a new surface layer made amorphous 19. This additional amorphization is thus carried out in such a manner as to preserve a crystalline seed near the layer of oxide 21. This additional amorphization is followed by an additional recrystallisation in solid phase that leads to a new transferred monocrystalline thin layer 22.

Figure 11:
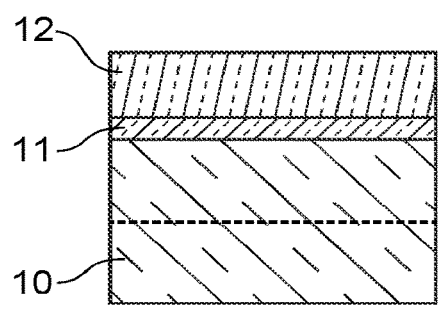
FIGS. 11 and 12 illustrate a first amorphization alternative.
Figure 12:
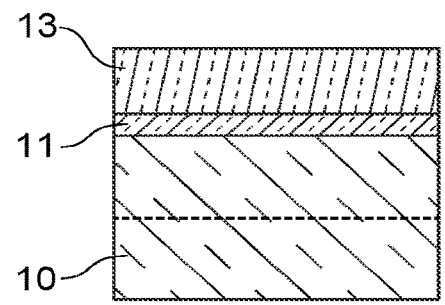

In another embodiment illustrated in FIGS. 11 and 12, the method comprises an amorphization of the entirety of the semiconductor layer 12 leading to an amorphous layer 13. This amorphization can be preceded by a selective amorphization of the smoothing layer 11 with respect to the semiconductor layer 12. The selective amorphization of the smoothing layer is made possible by the fact that it is achieved to a lower extent than the amorphization of the semiconductor layer 12.

Figure 13:
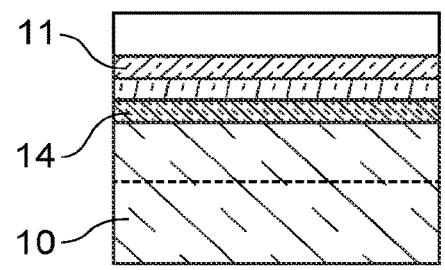
FIG. 13 illustrates another amorphization alternative.

In another embodiment illustrated by FIG. 13, the amorphisation of at least a part of the semiconductor layer comprises the joint amorphisation of the semiconductor layer, of the smoothing layer and optionally of a part of the support substrate 10 in such a way that the layer rich in interstitial atoms 14 is located in the support substrate 10. This layer 14 is later removed by the selective etching of the transferred part of the support substrate using the smoothing layer 11 as a stop layer.

When the recrystallisation is carried out in the presence of the smoothing layer, there is a risk of the smoothing layer, which is subjected during the recrystallisation to biaxial compressive stresses to preserve the mesh parameter of the material of the semiconductor layer, relaxing its stresses while forming dislocations. These dislocations are capable of propagating in the transferred monocrystalline semiconductor layer 18 and thus of degrading the performance of components that are later created via this layer. To reduce the risk of formation of these dislocations, a finer smoothing layer can be used, having for example a thickness of less than 20 nm, preferably less than 15 nm for a layer having a concentration of germanium of 20%, or a thickness of less than 15 nm, preferably less than 10 nm for a layer having a concentration of germanium of 25%, or a thickness of less than 10 nm, preferably less than 5 nm for a layer having a concentration of germanium of 30%.

Figure 14:
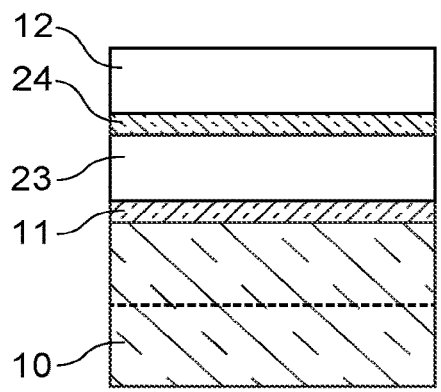
FIG. 14 shows another possible embodiment of the donor substrate with double etch stop layers.

With such a fineness, the smoothing layer could be not sufficiently robust for the selective etching of the finishing treatment aimed at both the smoothing and the thinning. One solution to bypass this difficulty involves only conferring a smoothing function onto the smoothing layer 11 and doubling it with a thinning layer 24, also pseudomorphous, dedicated to the thinning allowing to reach the desired thickness for the transferred semiconductor layer. For this purpose, as shown in FIG. 14, the donor substrate further comprises an intermediate layer 23 (for example made of silicon) and said thinning layer 24 (for example made of silicon-germanium) interposed between the intermediate layer 23 and the semiconductor layer 12. The thinning layer 24 forms an etch stop layer with respect to the material of the semiconductor layer. The finishing step thus comprises the successive carrying out of a selective etching of the smoothing layer 11 with respect to the intermediate layer 23, of a selective etching of the intermediate layer 23 with respect to the thinning layer 24 and of a selective etching of the thinning layer 24 with respect to the semiconductor layer 12.

Figure 15:
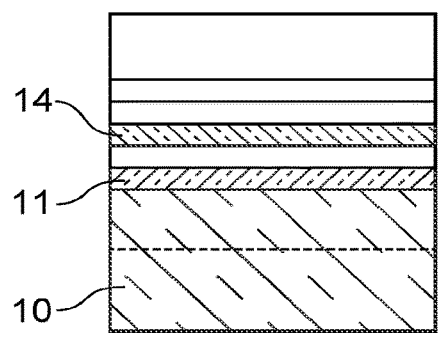
FIG. 15 shows a first possible amorphization of the donor substrate of FIG. 14.

As shown in FIG. 15, the amorphization of at least a part of the semiconductor layer can thus comprise the joint amorphization of the semiconductor layer 12 and of the thinning layer 24 in such a way that the layer rich in interstitial atoms 14 is located between the thinning layer 24 and the smoothing layer 11. The smoothing layer 11 is not made amorphous, it does not have to be recrystallised and does not therefore generate dislocations during the recrystallisation. It can therefore be thicker and/or have a higher concentration of germanium, thus making the selective etching more stable in terms of performance. As for the thinning layer 24, it can be relatively fine since the roughness is already largely compensated for using the smoothing layer. By forming an etch stop layer, it allows to easily eliminate the layer rich in interstitial atoms.

Figure 16:
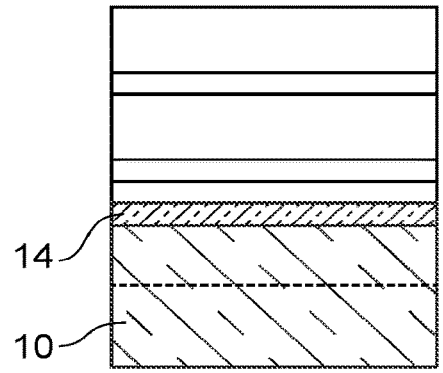
FIG. 16 shows a second possible amorphization of the donor substrate of FIG. 14.

As shown in FIG. 16, the amorphization of at least a part of the semiconductor layer can also comprise the joint amorphization of the semiconductor layer 12, of the thinning layer 24, of the intermediate layer 23 and of the smoothing layer 11 in such a way that the layer rich in interstitial atoms 14 is located in the support substrate.

It was shown above that the donor substrate could be covered with a layer of oxide, the latter being in particular intended to form a buffer zone between the bonding interface and the components remaining to be manufactured in the second layer in such a way that the latter have optimal electric characteristics for example such as a low surface-state density at the interface between the active layer and the layer of oxide.

A first difficulty is due to the presence of the smoothing layer typically made of silicon-germanium which makes it so that an oxidation thermal budget that is too great must not be provided in order to avoid a diffusion of the germanium and a relaxation of the stresses (formation of dislocations) of the layer of silicon-germanium. In practice, the temperature must not exceed 800° C., while preferably being in the range 700-750° C. The kinetics of the oxidation process are thus reduced and obtaining layers thicker than 15 nm can require a prohibitive time.

Another difficulty is due to the amorphization of a crystalline layer of silicon through a layer of oxide made of $SiO_2$, this amorphization creating a transition layer at the interface. The thicker the layer of oxide, the greater the quantity of atoms of oxygen present in the layer of silicon and the more the effectiveness of the SPER recrystallisation is reduced.

In order to bypass these difficulties, the invention proposes in one possible embodiment to form, before the amorphization of at least a part of the semiconductor layer, a fine dielectric layer via a low-temperature heat treatment. This involves for example forming a dielectric layer having a thickness between for example 5 nm and 25 nm by thermal oxidation at a temperature preferably lower than 800° C. This dielectric layer can then, after the amorphization of at least a part of the semiconductor layer, be subject to a thickening via a deposition of a dielectric at low temperature, for example SiN or $SiO_2$ deposited by PECVD. This deposition can thus be carried out at a temperature of up to 500° C. if it is carried out before the formation of the fragilization plane by H/He implantation. It can be carried out at a temperature lower than 250° C. in the contrary case.

The invention claimed is:

1. A method for creating a substrate of semiconductor on insulator type, comprising:
    a) providing a donor substrate comprising a monocrystalline support substrate, a smoothing layer and a semiconductor layer, the smoothing layer forming an etch stop layer having etch selectivity with respect to a material of the monocrystalline support substrate, and the smoothing layer comprising silicon and germanium;
    a') implantation of fs ion species through the semiconductor layer so as to form a fragilisation plane;
    b) creating an assembly by placing the donor substrate and a receiver substrate in contact; and
    c) transferring the semiconductor layer and at least a part of the smoothing layer by detachment along the fragilization plane,
    wherein the semiconductor layer of the donor substrate provided in step a) is monocrystalline and wherein the method further comprises the following steps:
    before step b), amorphization of at least a part of the semiconductor layer to form an amorphous layer by implantation of second ion species different than the first ion species; and
    after step c), recrystallization in solid phase of the amorphous layer to form a transferred monocrystalline semiconductor layer comprising the semiconductor of the semiconductor on insulator substrate.

2. The method according to claim 1, wherein said recrystallisation is followed by an amorphization of the transferred monocrystalline semiconductor layer to form a new amorphous layer and by a recrystallization in solid phase of the new amorphous layer to form a new transferred monocrystalline semiconductor layer.

3. The method according to claim 1, further comprising a removal of a layer rich in interstitial atoms present on a surface of the transferred monocrystalline semiconductor layer.

4. The method according to claim 3, wherein said removal comprises plasma-assisted oxidation followed by chemical etching.

5. The method according to claim 1, wherein the amorphization of at least a part of the semiconductor layer comprises the amorphization of the entirety of the semiconductor layer.

6. The method according to claim 1, wherein the amorphization of at least a part of the semiconductor layer comprises joint amorphization of the semiconductor layer and of the smoothing layer.

7. The method according to claim 1, wherein the donor substrate provided in step a) further comprises an intermediate layer and a thinning layer interposed between the intermediate layer and the semiconductor layer, the thinning layer forming an etch stop layer with respect to the material of the semiconductor layer and wherein step d) further comprises the successive carrying out of a selective etching of the smoothing layer with respect to the intermediate layer, of a selective etching of the intermediate layer with respect to the thinning layer and of a selective etching of the thinning layer with respect to the semiconductor layer.

8. The method according to claim 7, wherein the amorphization of at least a part of the semiconductor layer comprises joint amorphization of the semiconductor layer and of at least a part of the thinning layer.

9. The method according to claim 7, wherein the amorphization of at least a part of the semiconductor layer comprises the joint amorphization of the semiconductor layer, of the thinning layer and of at least a part of the intermediate layer.

10. The method according to claim 7, wherein the amorphization of at least a part of the semiconductor layer comprises the joint amorphization of the semiconductor layer, of the thinning layer, of the intermediate layer and of at least a part of the smoothing layer.

11. The method according claim 1, wherein during the step a') of implantation of ion species, the fragilization plane is formed in the support substrate, and wherein the method further comprises, after step c) of transferring, the following step:
    d) carrying out a selective etching of said part of the support substrate with respect to the smoothing layer.

12. The method according to claim 11, wherein step d) further comprises performing of selective etching of the smoothing layer.

13. The method according to claim 1, wherein during step a') of implantation of ionic species, the fragilization plan is formed in the smoothing layer.

14. The method according to claim 1, comprising, before the amorphization of at least a part of the semiconductor layer, formation on the semiconductor layer, by thermal oxidation at a temperature lower than 800° C., of a dielectric layer having a thickness between 5 nm and 25 nm, said dielectric layer being in step b) at the interface of the donor and receiver substrates placed in contact.

15. The method according to claim 14, wherein said formation further comprises, after the amorphization of at least a part of the semiconductor layer, a thickening of the dielectric layer via a deposition of a dielectric at low temperature.

16. The method according to claim 1, further comprising, after the formation of the amorphous layer and before said implantation, deposition of one or more layers on the donor substrate.

17. The method according to claim 1, wherein the receiver substrate integrates a level of microelectronic components.

18. The method according to claim 1, wherein the semiconductor layer comprises silicon.

19. The method according to claim 1, wherein a germanium content of the smoothing layer is between 20 and 40%.

20. A method for creating a substrate of semiconductor on insulator type, comprising:
    providing a donor substrate comprising a monocrystalline support substrate, a smoothing layer and a semiconductor layer, the smoothing layer forming an etch stop layer having etch selectivity with respect to a material of the monocrystalline support substrate;
    implantation of first ion species through the semiconductor layer so as to form a fragilisation plane;
    creating an assembly by placing the donor substrate and a receiver substrate in contact;
    transferring the semiconductor layer and at least a part of the smoothing layer by detachment along the fragilization plane; and
    removing the smoothing layer,
    wherein the semiconductor layer of the donor substrate is monocrystalline and wherein the method further comprises the following steps:
    before the creating, amorphization of at least a part of the semiconductor layer to form an amorphous layer by implantation of second ion species different than the first ion species; and
    after the transferring, recrystallization in solid phase of the amorphous layer to form a transferred monocrystalline semiconductor layer comprising the semiconductor of the semiconductor on insulator substrate.

\* \* \* \* \*